(12) United States Patent
Uehara et al.

(10) Patent No.: US 8,963,012 B2
(45) Date of Patent: Feb. 24, 2015

(54) FLEXIBLE CIRCUIT BOARD

(75) Inventors: Hiroharu Uehara, Saitama (JP);
Katsuhide Nakai, Saitama (JP); Hiroki Shirato, Saitama (JP)

(73) Assignee: Canon Components, Inc. (JP)

( * ) Notice: Subject to any disclaimer, the term of this patent is extended or adjusted under 35 U.S.C. 154(b) by 147 days.

(21) Appl. No.: 13/351,323

(22) Filed: Jan. 17, 2012

(65) Prior Publication Data
US 2012/0186858 A1 Jul. 26, 2012

(30) Foreign Application Priority Data
Jan. 17, 2011 (JP) ................................. 2011-007362

(51) Int. Cl.
| H05K 1/00 | (2006.01) |
| H05K 1/18 | (2006.01) |
| H05K 1/05 | (2006.01) |
| H05K 3/40 | (2006.01) |

(52) U.S. Cl.
CPC ............... *H05K 1/189* (2013.01); *H05K 1/056* (2013.01); *H05K 3/4092* (2013.01); *H05K 2203/1545* (2013.01); *H01L 2924/0002* (2013.01)
USPC ...................................................... 174/254

(58) Field of Classification Search
CPC ....... H05K 1/00; H05K 1/0393; H05K 1/118; H05K 1/028; H05K 3/28; H05K 3/281
USPC ........................................................ 174/254
See application file for complete search history.

(56) References Cited

U.S. PATENT DOCUMENTS

| 7,391,153 | B2 | 6/2008 | Suehiro et al. | |
| 7,755,715 | B2 | 7/2010 | Kimura et al. | |
| 7,960,747 | B2 | 6/2011 | Sakamoto et al. | |
| 2004/0061240 | A1* | 4/2004 | Seko | 257/782 |
| 2005/0116235 | A1 | 6/2005 | Schultz et al. | |
| 2007/0088134 | A1* | 4/2007 | Suzuki et al. | 525/421 |
| 2009/0007421 | A1* | 1/2009 | Chen et al. | 29/825 |
| 2009/0194319 | A1* | 8/2009 | Itoh et al. | 174/250 |
| 2009/0203165 | A1* | 8/2009 | Pinarbasi et al. | 438/95 |
| 2010/0151116 | A1* | 6/2010 | Takahashi et al. | 427/8 |

(Continued)

FOREIGN PATENT DOCUMENTS

| JP | 60-119769 | 8/1985 |
| JP | 05-029395 A | 2/1993 |

(Continued)

OTHER PUBLICATIONS

Office Action issued in corresponding Japanese Patent Application No. 2011-007362 dated Jan. 29, 2013.

(Continued)

*Primary Examiner* — Timothy Thompson
*Assistant Examiner* — Charles Pizzuto
(74) *Attorney, Agent, or Firm* — Rossi, Kimms & McDowell LLP (57) ABSTRACT

A flexible circuit board includes a base film which is composed of an aluminum sheet and first protective films formed on the respective surfaces of the aluminum sheet and has a sprocket hole and a device hole, a predetermined conductor pattern which is formed on a surface of the base film, and a second protective film which is composed of aluminum and an electrically insulative film formed on a surface of the aluminum and is formed so as to cover the predetermined conductor pattern.

3 Claims, 7 Drawing Sheets

(56) References Cited

U.S. PATENT DOCUMENTS

| | | |
|---|---|---|
| 2012/0138997 A1 | 6/2012 | Tasaki et al. |
| 2012/0186858 A1 | 7/2012 | Uehara et al. |
| 2013/0092421 A1* | 4/2013 | Kajiya .................. 174/252 |
| 2013/0176739 A1 | 7/2013 | Uehara |

FOREIGN PATENT DOCUMENTS

| | | |
|---|---|---|
| JP | 2005-070240 A | 3/2005 |
| JP | 2005-123477 A | 5/2005 |
| JP | 2005-136224 A | 5/2005 |
| JP | 2005166780 A * | 6/2005 ............ H05K 1/02 |
| JP | 2005-283852 A | 10/2005 |
| JP | 2006-286702 A | 10/2006 |
| JP | 2007-018926 A | 1/2007 |
| JP | 2007-110010 A | 4/2007 |
| JP | 2007-513520 A | 5/2007 |
| JP | 2007-189261 A | 7/2007 |
| JP | 2007-200869 A | 8/2007 |
| JP | 2007-208221 A | 8/2007 |
| JP | 2007-273972 A | 10/2007 |
| JP | 2008-141073 A | 6/2008 |
| JP | 2008-187030 A | 8/2008 |
| JP | 2008-244285 A | 10/2008 |
| JP | 2009-025679 A | 2/2009 |
| JP | 2009-111180 A | 5/2009 |
| JP | 2009-129801 A | 6/2009 |
| JP | 2009-188187 A | 8/2009 |
| JP | 2009-231584 A | 10/2009 |
| JP | 2009-302110 A | 12/2009 |
| JP | 2010-189614 A | 9/2010 |
| JP | 2010-232252 A | 10/2010 |
| JP | 2011-126262 A | 6/2011 |
| JP | 2012-151192 A | 8/2012 |
| WO | 2011118108 A1 | 9/2011 |
| WO | 2011118109 A1 | 9/2011 |

OTHER PUBLICATIONS

Japanese Office Action for JP 2013-109794, mail date Oct. 8, 2013. Cited in related U.S. Appl. No. 13/734,089.
Court Hearing for JP 2012-236025, mail date Nov. 12, 2013. Cited in related U.S. Appl. No. 13/734,089.
Japanese Office Action for JP 2012-236025, mail date Jul. 9, 2013. Cited in related U.S. Appl. No. 13/734,089.
Japanese Office Action for JP 2012-236025, mail date Mar. 29, 2013. Cited in related U.S. Appl. No. 13/734,089.

* cited by examiner

FLEXIBLE CIRCUIT BOARD

CROSS-REFERENCE TO RELATED APPLICATIONS

This application is based upon and claims the benefit of priority of the prior Japanese Patent Application No. 2011-007362, filed on Jan. 17, 2011, the entire contents of which are incorporated herein by reference.

BACKGROUND OF THE INVENTION

1. Field of the Invention

The present invention relates to a flexible circuit board.

2. Description of the Related Art

A resin composition of, e.g., polyimide (PI), polyethylene terephthalate (PET), or polyethylene naphthalate (PEN) is generally used as the material for a base film of a flexible circuit board (FPC) (see Patent Documents 1 and 2). For example, Patent Document 2 discloses a configuration which uses polyimide or polyethylene terephthalate as the material for a base film of a flexible circuit board.

However, a configuration using a film of a resin composition as a base film of a flexible circuit board may suffer from the problems below.

Resin compositions as described above are expensive, which makes it difficult to reduce the price of a flexible circuit board.

Examples of a flexible circuit board include a carrier tape for TAB (Tape Automated Bonding). A carrier tape for TAB has a sprocket hole for positioning in bonding and a device hole for mounting a device, an electronic component, or the like. A sprocket hole and a device hole are openings extending through a base film in a thickness direction. Etching or die-punching is used to form such an opening. A process of forming an opening in a base film of a resin composition by etching is costly and is very low in processing rate. Die-punching requires facilities for punching, which increases facilities cost.

Flexible circuit boards have been increasing in width in order to, e.g., enhance production efficiency. However, a base film made of a resin composition is considerably deformed or varies widely in dimensions due to a temperature change, moisture absorption, or the like. For this reason, the yield of flexible circuit boards using a resin composition as the material for a base film tends to decrease with an increase in width.

In recent years, the density or the number of layers of wiring patterns to be formed at a flexible circuit board or devices or the like to be mounted on the flexible circuit board has been increasing. However, due to the low thermal conductivity of a resin composition, the higher density or the larger number of layers increases thermal load on a mounted device and the like. An increase in the density or the number of layers is thus hard to achieve.

Patent Document 1
Japanese Laid-open Patent Publication No. 05-029395
Patent Document 2
Japanese Laid-open Patent Publication No. 2007-18926

SUMMARY OF THE INVENTION

It is an object of the present invention, which has been made in consideration of the above-described circumstances, to provide a flexible circuit board capable of achieving a price reduction and a method for manufacturing the flexible circuit board. It is another object of the present invention to provide a flexible circuit board whose opening is easy to form and a method for manufacturing the flexible circuit. It is another object of the present invention to provide a flexible circuit board whose density or whose number of layers is easy to increase and a method for manufacturing the flexible circuit board.

In order to achieve the above-described objects, a flexible circuit board according to the present invention includes a base film which is composed of an aluminum sheet and a first protective film formed on a surface of the aluminum sheet and which has an opening extending through the base film in a thickness direction. The opening includes one or both of a sprocket hole and a device hole. The flexible circuit board further includes a conductor pattern formed on a surface of the base film and a second protective film formed so as to cover the conductor pattern. The second protective film is a film which includes an electrically insulative film formed on a surface of aluminum.

DETAILED DESCRIPTION OF THE PREFERRED EMBODIMENTS

An embodiment of the present invention will be described below in detail with reference to the drawings. A flexible circuit board 1 according to the embodiment of the present invention is a suitable flexible circuit board (FPC: Flexible Print Circuit) for a carrier tape for TAB (Tape Automated Bonding).

Figure 1:
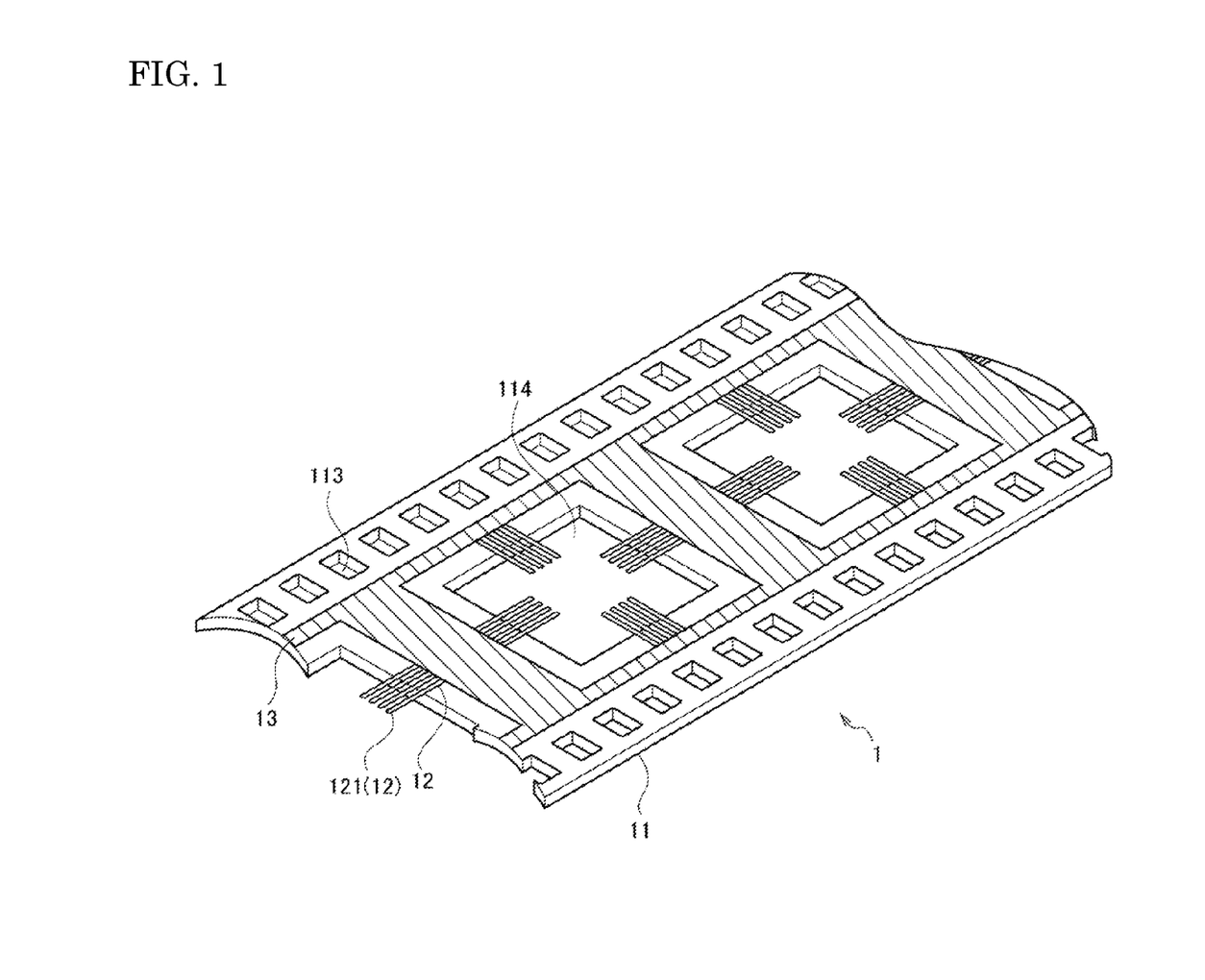
FIG. 1 is a perspective view schematically showing the configuration of a flexible circuit board according to an embodiment of the present invention.
Figure 2:
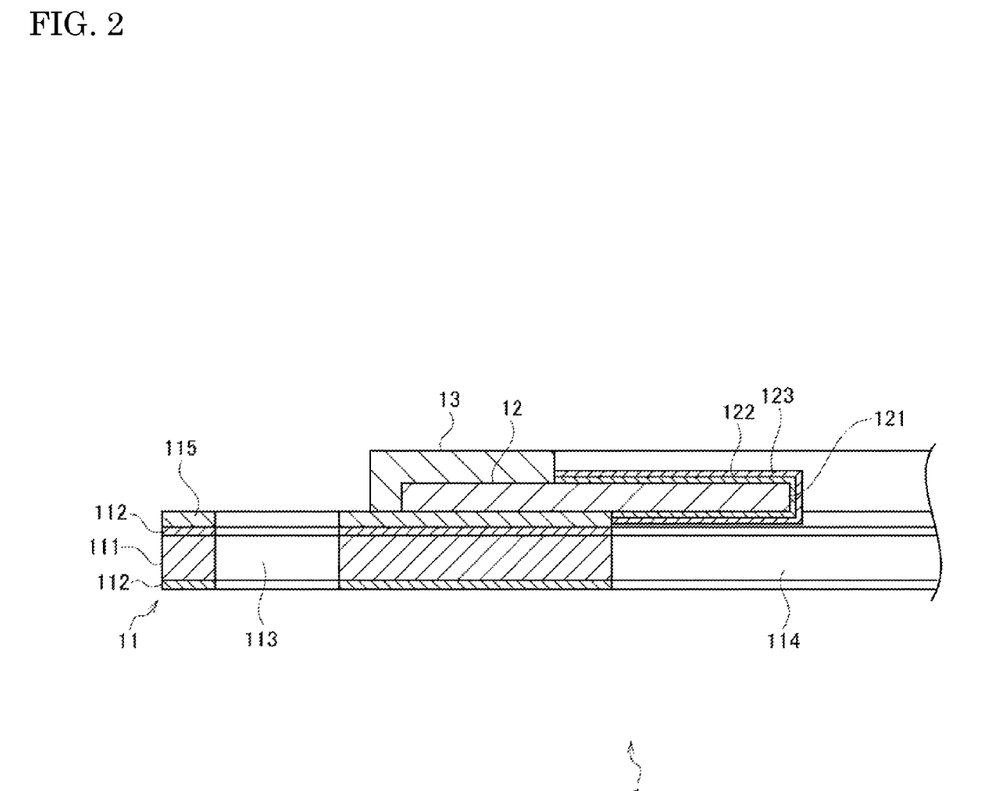
FIG. 2 is a cross-sectional view schematically showing the configuration of the flexible circuit board according to the embodiment of the present invention.

The configuration of the flexible circuit board 1 according to the embodiment of the present invention will first be described. FIG. 1 is an external perspective view schematically showing the configuration of the flexible circuit board 1 according to the embodiment of the present invention. FIG. 2 is a cross-sectional view schematically showing the configuration of the flexible circuit board 1 according to the embodiment of the present invention.

As shown in FIGS. 1 and 2, the flexible circuit board 1 according to the embodiment of the present invention includes a base film 11, a predetermined conductor pattern 12, and a second protective film 13. In the flexible circuit board 1 according to the embodiment of the present invention, the predetermined conductor pattern 12 is formed on a surface of the base film 11, and the second protective film 13 is formed so as to cover the predetermined conductor pattern 12. That is, the predetermined conductor pattern 12 is sandwiched between the base film 11 and the second protective film 13, except for a predetermined part (to be described later).

As shown in FIG. 1, the base film 11 is formed into a strip having a predetermined width. Sprocket holes 113 and device holes 114 are formed in the base film 11. The sprocket holes 113 and device holes 114 are each an opening extending through the base film 11 in a thickness direction. The sprocket holes 113 are formed in each side edge of the base film 11 to be tandemly arranged at predetermined intervals along a longitudinal direction. The sprocket holes 113 are used to position and feed the flexible circuit board 1 according to the embodiment of the present invention in a process of mounting a device, an electronic component, and the like on the flexible circuit board 1 according to the embodiment of the present invention (=bonding). Each device hole 114 is formed at a predetermined position of the base film 11. The device holes 114 are openings for mounting a device, an electronic component, and the like. The dimensions, shape, and position of each device hole 114 are appropriately set depending on a device or an electronic component to be mounted, the predetermined conductor pattern 12 to be formed, and the like and are not specifically limited.

As shown in FIG. 2, the base film 11 includes an aluminum sheet 111, a first protective film 112, and a thermosetting adhesive 115. In the base film 11, the first protective film 112 is formed on each surface of the aluminum sheet 111, and a film of the thermosetting adhesive 115 is formed on a surface of one of the first protective films 112.

Note that the thickness of the aluminum sheet 111 is not specifically limited and is appropriately set depending on performance demanded of the flexible circuit board 1 according to the embodiment of the present invention. For example, a thickness of 50 µm can be used. The material for and thickness of the first protective films 112 are also not specifically limited. For example, a film of varnish having a thickness of 3 to 10 µm can be used as the first protective film 112. Similarly, the kind of the thermosetting adhesive 115 is not specifically limited. A thermosetting adhesive of any known kind can be used as the thermosetting adhesive.

The configuration of the base film 11 is not limited to the configuration shown in FIG. 2. For example, the base film 11 may not include the first protective film 112. That is, the base film 11 may include the aluminum sheet 111 and the film of the thermosetting adhesive 115, and the film of the thermosetting adhesive 115 may be formed on one surface of the aluminum sheet 111.

The predetermined conductor pattern 12 is formed on the surface where the film of the thermosetting adhesive 115 is formed. The predetermined conductor pattern 12 is bonded to the one surface of the base film by the thermosetting adhesive 115. The predetermined conductor pattern 12 is a pattern which is to serve as a circuit (=wiring) in the flexible circuit board 1 according to the embodiment of the present invention. The specific configuration of the predetermined conductor pattern 12 is appropriately set depending on the function, use, and the like of the flexible circuit board 1 according to the embodiment of the present invention and is not specifically limited. For example, an aluminum sheet having a thickness of 10 to 50 µm or a copper sheet having a thickness of 9 to 35 µm can be used as the predetermined conductor pattern 12.

An inner lead 121 and a contact pad (not shown) are provided on the predetermined conductor pattern 12. The inner lead 121 is a portion for electrically connecting a device, an electronic component, or the like to be mounted on the flexible circuit board 1 according to the embodiment of the present invention and the predetermined conductor pattern 12. As shown in FIGS. 1 and 2, the inner lead 121 is a portion projecting toward the inner side of the corresponding device hole 114. The contact pad (not shown) is a portion which is to serve as a contact (terminal) for electrically connecting the flexible circuit board 1 according to the embodiment of the present invention to the outside. A nickel coating and a gold coating are applied to the inner lead 121 and contact pad. More specifically, as shown in FIG. 2, a nickel film (nickel-plated layer) 122 is formed on the surface of the inner lead 121, and a gold film (gold-plated layer) 123 is formed on the surface of the nickel film 122.

The second protective film 13 is formed on the one surface of the base film 11 so as to cover the predetermined conductor pattern 12. The second protective film 13 is electrically insulative. For this reason, as shown in FIG. 2, the predetermined conductor pattern 12 is buried in the second protective film 13 so as not to be exposed to the outside. In other words, the predetermined conductor pattern 12 is sandwiched between the base film 11 and the second protective film 13. The second protective film 13 has a function of protecting the predetermined conductor pattern 12, a function of ensuring electric insulation between the predetermined conductor patterns 12, a function of preventing a short between the predetermined conductor pattern 12 and the outside, and other functions. A cover lay film which is made of an aramid-based resin composition and includes a film (not shown) of an adhesive formed on one surface can be used as the second protective film 13. For example, a film which includes a film of a polyimide-based adhesive formed thereon and is made of an aramid-based resin composition can be used. Alternatively, a film which includes a film of a polyimide-based adhesive formed thereon and is made of a polyimide-based resin composition can be used. Alternatively, a film which is made of a conductor such as aluminum and includes an electrically insulative film formed on a surface can be used as the second protective film 13. The material for the electrically insulative film is not specifically limited. For example, a resin composition of any known kind can be used. As described above, the second protective film 13 only needs to be electrically insulative.

A method for manufacturing the flexible circuit board 1 according to the embodiment of the present invention will be described. The method for manufacturing the flexible circuit board 1 according to the embodiment of the present invention includes an opening forming process, a conductor pattern forming process, and a predetermined process subsequent to the processes. The opening forming process is a process of forming the sprocket holes 113 and device holes 114 serving as openings (=through holes) in the base film 11. The conductor pattern forming process is a process of forming the predetermined conductor pattern 12 such as a wiring pattern on the base film with the openings formed therein.

FIGS. 3A to 3D and 4A to 4C are cross-sectional views schematically showing the opening forming process of the method for manufacturing the flexible circuit board 1 according to the embodiment of the present invention.

Figure 3A:
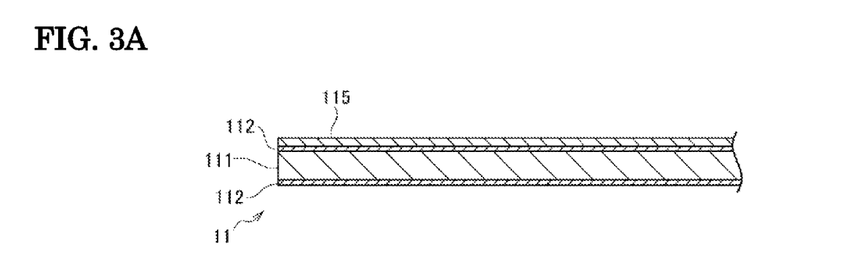
FIG. 3A is a cross-sectional view schematically showing a method for manufacturing the flexible circuit board according to the embodiment of the present invention and is a view showing an opening forming process.
Figure 3B:
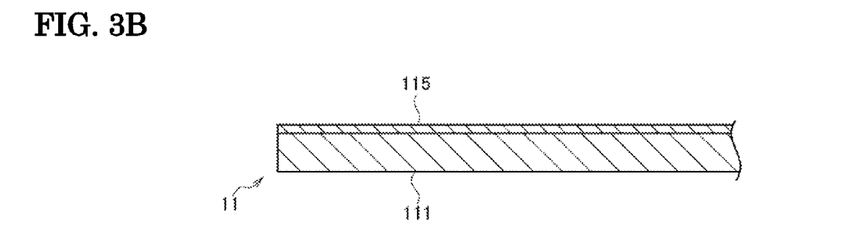
FIG. 3B is a cross-sectional view schematically showing the method for manufacturing the flexible circuit board according to the embodiment of the present invention and is a view showing the opening forming process.

As shown in FIG. 3A, the base film 11 includes the aluminum sheet 111, first protective film 112, and thermosetting adhesive 115. In the base film 11, the first protective film 112 is formed on each surface of the aluminum sheet 111, and a film of the thermosetting adhesive 115 is formed on a surface of one of the first protective films 112. Note that the thickness of the aluminum sheet 111 is not specifically limited and is appropriately set depending on, e.g., performance demanded of the flexible circuit board 1 according to the embodiment of the present invention. The configuration of the base film 11 is not limited to the configuration shown in FIG. 3A. For example, as shown in FIG. 3B, the base film 11 may not include the first protective film 112. That is, the base film 11 may include the aluminum sheet 111 and a film of thermosetting adhesive 115, and the film of the thermosetting adhesive 115 may be formed on one surface of the aluminum sheet 111.

In the opening forming process, openings such as the sprocket hole 113 and the device hole 114 are formed in the base film 11. The openings extend through the base film 11 in the thickness direction.

Figure 3C:
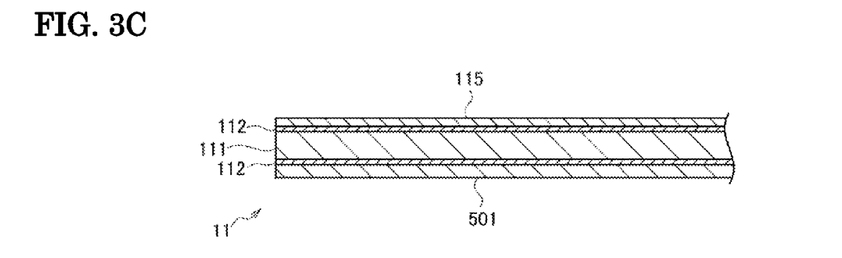
FIG. 3C is a cross-sectional view schematically showing the method for manufacturing the flexible circuit board according to the embodiment of the present invention and is a view showing the opening forming process.

As shown in FIG. 3C, a film of a first photoresist 501 is formed on a surface (=the surface where the film of the thermosetting adhesive 115 is not formed) of the first protective film 112 of the base film 11. A known material and a known method can be used as the material for the film of the first photoresist 501 and a method for forming the film. For example, a process of coating a surface of the first protective film 112 of the base film 11 with the first photoresist 501 by roll-to-roll processing and drying the first photoresist 501 can be used. Although the first photoresist 501 may be of the positive type or the negative type, FIGS. 3C to 4B show a configuration in which the first photoresist 501 is of the negative type (a type which has a lower degree of solubility in a developer when irradiated with light energy).

Figure 3D:
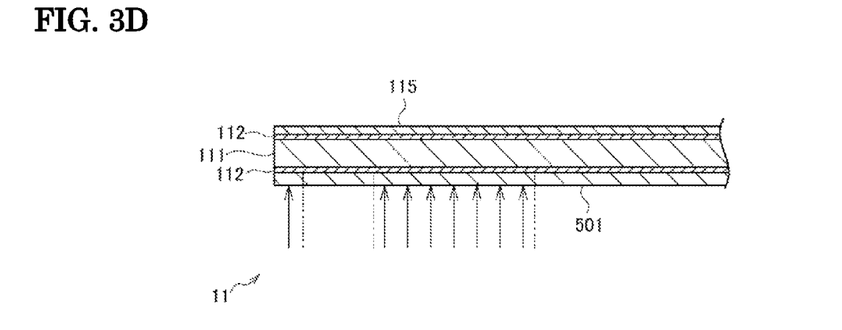
FIG. 3D is a cross-sectional view schematically showing the method for manufacturing the flexible circuit board according to the embodiment of the present invention and is a view showing the opening forming process.

As shown in FIG. 3D, the formed film of the first photoresist 501 is subjected to exposure. More specifically, a predetermined pattern is formed in the film of the first photoresist 501 by an ultraviolet exposure machine (not shown). If the first photoresist 501 is of the negative type, positions where the openings (=the sprocket hole 113 and device hole 114) are formed are not irradiated with light energy (e.g., ultraviolet rays) (=are shielded from light), and positions other than the positions are irradiated with light energy, as shown in FIG. 3D. The arrows in FIG. 3D schematically show applied light energy.

Figure 4A:
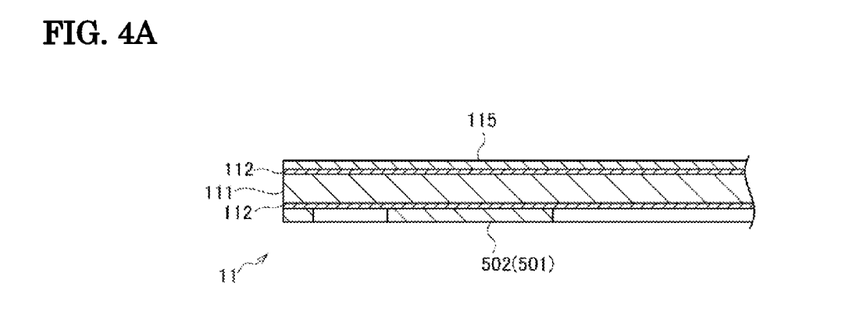
FIG. 4A is a cross-sectional view schematically showing the method for manufacturing the flexible circuit board according to the embodiment of the present invention and is a view showing the opening forming process.

As shown in FIG. 4A, the film of the first photoresist 501 having undergone the exposure is subjected to development. More specifically, of the film of the first photoresist 501, parts at the positions where the sprocket hole 113 and device hole 114 are formed are removed. After the development, a first resist pattern 502 is formed.

Figure 4B:
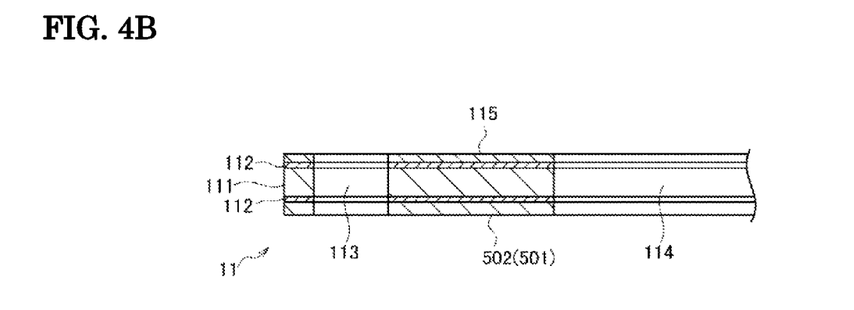
FIG. 4B is a cross-sectional view schematically showing the method for manufacturing the flexible circuit board according to the embodiment of the present invention and is a view showing the opening forming process.
Figure 4C:
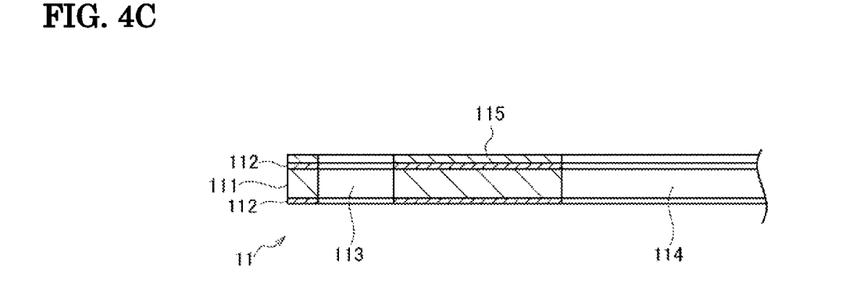
FIG. 4C is a cross-sectional view schematically showing the method for manufacturing the flexible circuit board according to the embodiment of the present invention and is a view showing the opening forming process.

As shown in FIG. 4B, the base film 11 is etched using the formed first resist pattern 502 as an etch mask. A wet etching technique or a dry etching technique of any known kind can be used to etch the base film 11. With the etching, openings (=the sprocket hole 113 and device hole 114) are formed in the base film 11. After the sprocket hole 113 and device hole 114 are formed, the first resist pattern 502 is peeled off, as shown in FIG. 4C. For example, caustic soda is used to peel off the first resist pattern 502.

After the above-described process, the base film 11 with the openings (=the sprocket hole 113 and device hole 114) formed therein is obtained. Note that although the embodiment of the present invention has described a configuration in which openings are formed in the base film 11 by etching, openings may be formed by die-punching using a die or the like.

The flow shifts to the conductor pattern forming process. In the conductor pattern forming process, the predetermined conductor pattern (=predetermined wiring pattern) 12 is formed on the base film 11 with the sprocket hole 113 and device hole 114 formed therein. FIGS. 5A to 5D and 6A to 6C are views schematically showing the conductor pattern forming process of the method for manufacturing the flexible circuit board 1 according to the embodiment of the present invention. Note that the specific configuration (e.g., the dimensions, shape, and number) of the predetermined conductor pattern 12 to be formed in the conductor pattern forming process is appropriately set depending on the function, use, and the like of the flexible circuit board 1 according to the embodiment of the present invention and is not specifically limited.

Figure 5A:
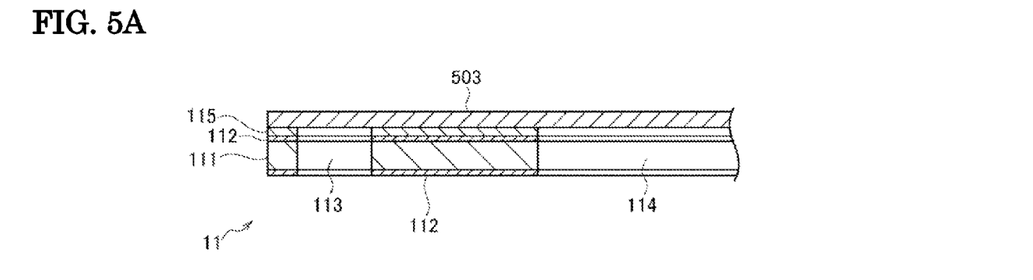
FIG. 5A is a cross-sectional view schematically showing the method for manufacturing the flexible circuit board according to the embodiment of the present invention and is a view showing a conductor pattern forming process.

As shown in FIG. 5A, a conductor sheet 503 is bonded to a surface of the thermosetting adhesive 115 of the base film 11 with the through holes formed therein. The material for and the thickness of the conductor sheet 503 are appropriately set depending on a function and the like demanded of the conductor pattern 12 to be formed. For example, an aluminum sheet having a thickness of 10 to 50 μm or a copper sheet having a thickness of 9 to 35 μm can be used as the conductor sheet 503. For example, pressure bonding with heating (=lamination) can be used as a method for bonding the conductor sheet 503. The thermosetting adhesive 115 between the base film 11 and the bonded conductor sheet 503 is heat cured by batch-type heat treatment.

Figure 5B:
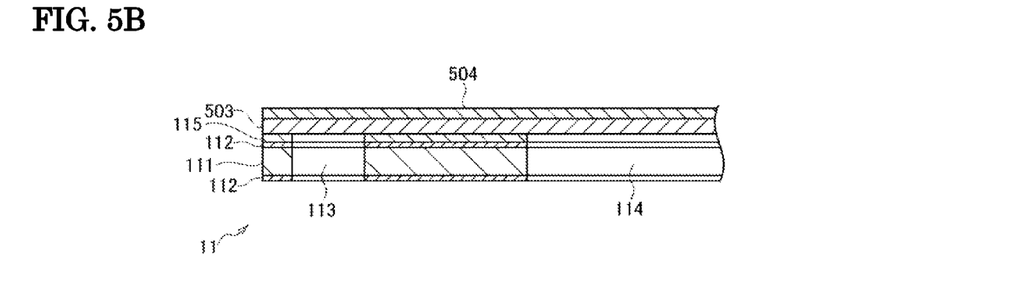
FIG. 5B is a cross-sectional view schematically showing the method for manufacturing the flexible circuit board according to the embodiment of the present invention and is a view showing the conductor pattern forming process.
Figure 5C:
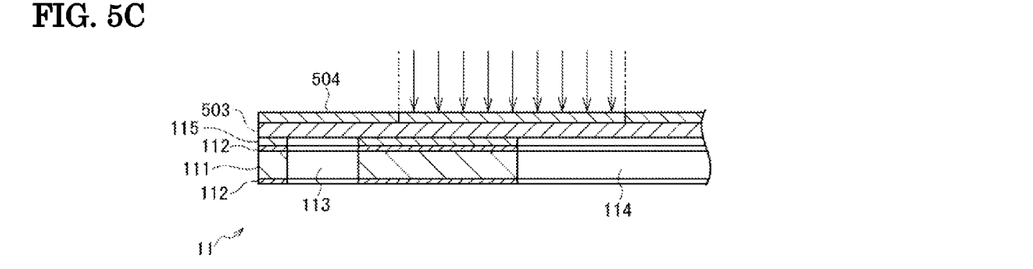
FIG. 5C is a cross-sectional view schematically showing the method for manufacturing the flexible circuit board according to the embodiment of the present invention and is a view showing the conductor pattern forming process.
Figure 5D:
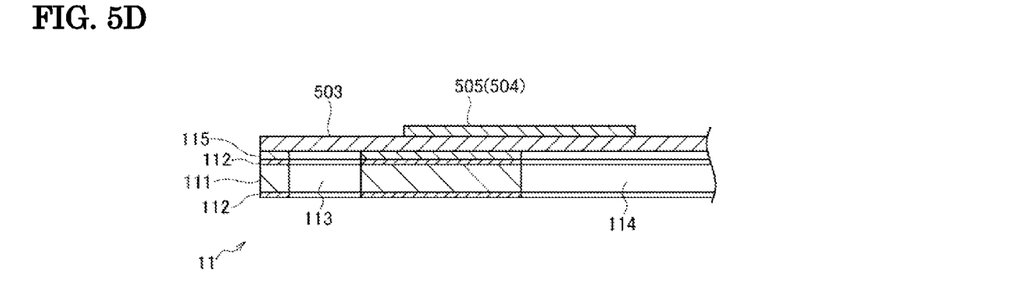
FIG. 5D is a cross-sectional view schematically showing the method for manufacturing the flexible circuit board according to the embodiment of the present invention and is a view showing the conductor pattern forming process.

After the thermosetting adhesive 115 is cured, as shown in FIG. 5B, a film of a second photoresist 504 is formed on a surface of the conductor sheet 503. The kind of the second photoresist 504 is not specifically limited, and a photoresist material of any known kind, such as a photosensitive resin composition, can be used. Any known method can be used as a method for forming the second photoresist 504. For example, a process of applying the second photoresist 504 by roll-to-roll processing and then drying the applied second photoresist 504 can be used. As shown in FIG. 5C, the formed film of the second photoresist 504 is subjected to exposure. The arrows in FIG. 5C schematically show applied light energy. Although the second photoresist 504 may be of the positive type or the negative type, FIG. 5C shows as an example a configuration in which the second photoresist 504 is of the negative type (a type which has a lower degree of solubility in a developer when irradiated with light energy). As shown in FIG. 5D, the film of the second photoresist 504 having undergone the exposure is subjected to development. After the development, a second resist pattern 505 is formed on the surface of the conductor sheet 503.

Figure 6A:
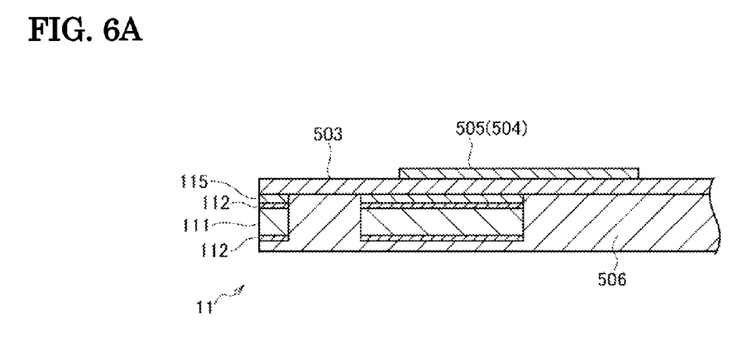
FIG. 6A is a cross-sectional view schematically showing the method for manufacturing the flexible circuit board according to the embodiment of the present invention and is a view showing the conductor pattern forming process.

As shown in FIG. 6A, a masking film 506 is formed on a surface opposite to the surface where the second resist pattern 505 is formed. The masking film 506 is a film which protects the aluminum sheet 111 of the base film 11 (=prevents the aluminum sheet 111 from being etched) in a process of patterning the conductor sheet 503 by etching to form the predetermined conductor pattern 12. A thermosetting resist is used as the masking film 506. The type of the thermosetting resist is not specifically limited, and a thermosetting resist of any known kind can be used. For example, a process of applying a thermosetting resist serving as a material for the masking film 506 and curing the thermosetting resist by heating can be used as a method for forming the masking film 506. When the masking film 506 is formed, the aluminum sheet 111 of the base film 11 is covered with the masking film 506. The openings (=the sprocket hole 113 and device hole 114) formed in the base film 11 are also filled with the thermosetting resist serving as the material for the masking film 506.

Figure 6B:
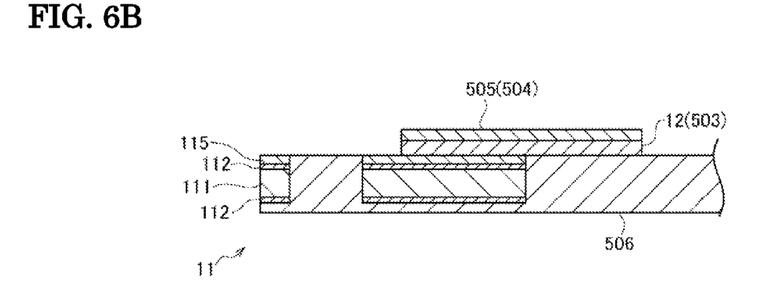
FIG. 6B is a cross-sectional view schematically showing the method for manufacturing the flexible circuit board according to the embodiment of the present invention and is a view showing the conductor pattern forming process.
Figure 6C:
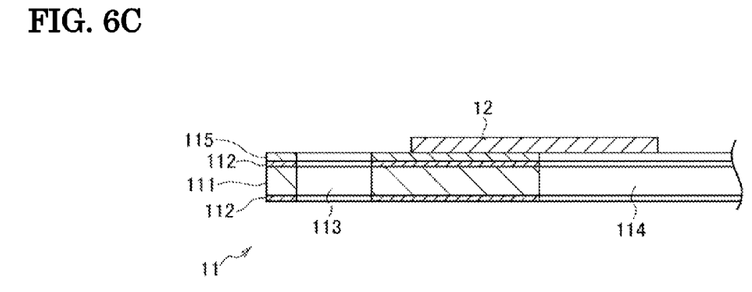
FIG. 6C is a cross-sectional view schematically showing the method for manufacturing the flexible circuit board according to the embodiment of the present invention and is a view showing the conductor pattern forming process.

As shown in FIG. 6B, the conductor sheet 503 is etched using the formed second resist pattern 505 as an etch mask. With the etching, the conductor sheet 503 is patterned to obtain the predetermined conductor pattern 12. Since the aluminum sheet 111 of the base film 11 is covered with the masking film 506, as described above, the aluminum sheet 111 is not etched. That is, the masking film 506 protects the aluminum sheet 111. After the etching, as shown in FIG. 6C, the second resist pattern 505 and masking film 506 are peeled off (removed). For example, caustic soda is used to peel off the second resist pattern 505 and masking film 506.

After the above-described process, the predetermined conductor pattern 12 is formed on the base film 11.

Figure 7A:
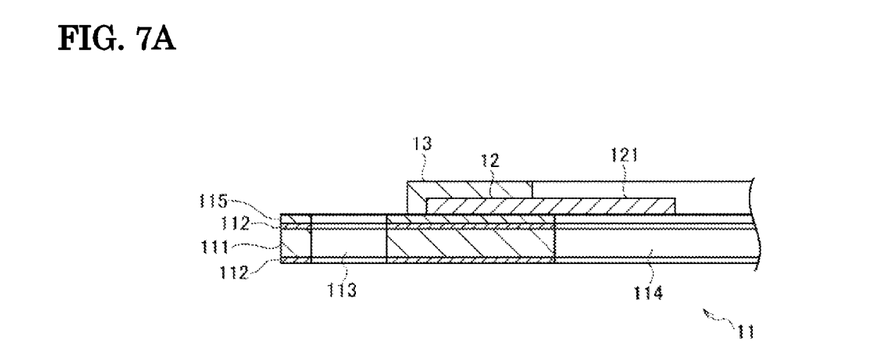
FIG. 7A is a cross-sectional view schematically showing the method for manufacturing the flexible circuit board according to the embodiment of the present invention and is a view showing a process subsequent to the opening forming process and the conductor pattern forming process.
Figure 7B:
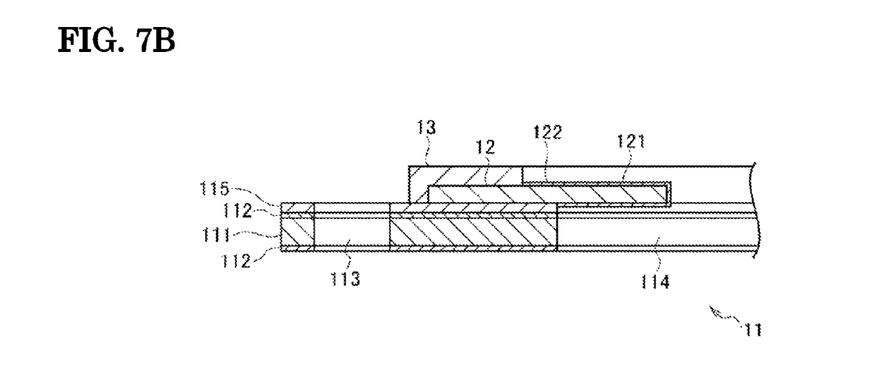
FIG. 7B is a cross-sectional view schematically showing the method for manufacturing the flexible circuit board according to the embodiment of the present invention and is a view showing the process subsequent to the opening forming process and the conductor pattern forming process.
Figure 7C:
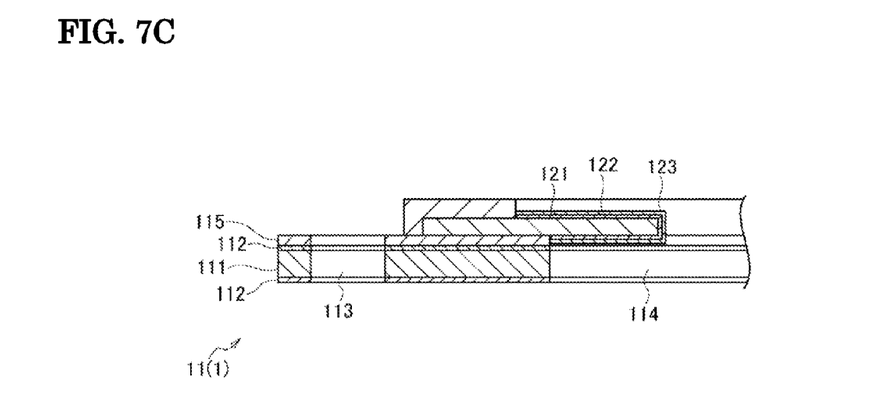
FIG. 7C is a cross-sectional view schematically showing the method for manufacturing the flexible circuit board according to the embodiment of the present invention and is a view showing the process subsequent to the opening forming process and the conductor pattern forming process.

FIGS. 7A to 7C are cross-sectional views schematically showing a process subsequent to the opening forming process and the conductor pattern forming process in the method for manufacturing the flexible circuit board 1 according to the embodiment of the present invention.

After the processes (=the opening forming process and the conductor pattern forming process), as shown in FIG. 7A, the second protective film 13 is formed so as to cover the predetermined conductor pattern 12. The second protective film 13 has a function of protecting the predetermined conductor pattern 12, a function of ensuring electric insulation between the predetermined conductor patterns 12, and a function of ensuring electric insulation between the predetermined conductor pattern 12 and another member. A cover lay film which includes a film (not shown) of a thermosetting adhesive formed on one surface can be used as the second protective film 13. First, the second protective film 13 is formed to have a predetermined shape. The second protective film 13 is positioned and bonded to the surface of the base film 11 after the processes with the film of the adhesive formed on the second protective film 13. The bonded second protective film 13 is heated to cure the adhesive. After the process, the predetermined conductor pattern 12 is covered with the second protective film (i.e., the predetermined conductor pattern 12 is buried in the second protective film 13) except a predetermined part (the inner lead 121 and a contact pad in this example).

Note that the material for the second protective film 13 is not specifically limited. For example, a film of an aramid-based resin or an aluminum film can be used as the cover lay film for the second protective film 13. If an aluminum film is used as the cover lay film, a film of an electrically insulative material is formed on a surface of the aluminum film.

As shown in FIGS. 7B and 7C, the predetermined part of the formed conductor pattern 12 is plated. More specifically, as shown in FIG. 7B, the predetermined part of the conductor pattern 12 is plated with nickel to form the nickel film (=nickel-plated layer) 122. As shown in FIG. 7C, the nickel-plated part is plated with gold to form the gold film (=gold-plated layer) 123. Note that the "predetermined part" plated with the metals includes, for example, the inner lead 121 and the contact pad. The inner lead 121 and the contact pad are portions serving as contacts for connection to a component to be mounted or the outside. The inner lead 121 is a portion projecting toward the inner side of the opening as the corresponding device hole 114.

After the above-described processes, manufacturing of the flexible circuit board 1 according to the embodiment of the present invention is completed.

The flexible circuit board 1 according to the embodiment of the present invention and the method for manufacturing the flexible circuit board 1 according to the embodiment of the present invention can produce the working-effects below.

The flexible circuit board 1 according to the embodiment of the present invention includes the aluminum sheet 111 as the base film 11. Deformation or a dimensional change caused by a temperature change or moisture absorption can be more effectively suppressed in the flexible circuit board 1 than in a configuration including a sheet of a resin composition.

Table 1 below is a table indicating a dimensional change of a flexible circuit board with a base film made of aluminum (=the flexible circuit board 1 according to the embodiment of the present invention) and a dimensional change of a flexible circuit board with a base film made of polyimide (a comparative example). More specifically, Table 1 indicates a difference between the spacing between sprocket holes after the sprocket holes are formed and the spacing after completion of a flexible circuit board. Note that a three-dimensional measuring machine is used to measure the spacing between sprocket holes. The base film 11 of the flexible circuit board 1 according to the embodiment of the present invention and the base film of the flexible circuit board as the comparative example each have a thickness of 50 μm and a width (=dimension in the X-axis direction) of 151 mm. A change in longitudinal dimension (=dimension in the Y-axis direction) is a dimensional change with respect to 147.25 mm.

TABLE 1

Dimensional Change Comparison

|  | X-axis direction (with respect to product width of 151 mm) | Y-axis direction (with respect to product longitudinal dimension of 147.25 mm) |
| --- | --- | --- |
| Embodiment of present invention (aluminum with thickness t of 50 μm) | −0.024 mm | −0.012 mm |
| Comparative example (polyimide with thickness t of 50 μm) | −0.057 mm | −0.039 mm |

As shown in Table 1, a dimensional change in the X-axis direction (width direction) of the flexible circuit board as the comparative example is −0.057 mm, and a dimensional change in the X-axis direction of the flexible circuit board according to the embodiment of the present invention is −0.024 mm. A dimensional change in the Y-axis direction (longitudinal direction) of the flexible circuit board as the comparative example is −0.039 mm, and a dimensional change in the Y-axis direction of the flexible circuit board according to the embodiment of the present invention is −0.012 mm. As seen from the above, the flexible circuit board 1 according to the embodiment of the present invention is lower in elasticity (i.e., smaller in dimensional change) than the conventional flexible circuit board made of a polyimide-based resin composition. Accordingly, even if a flexible circuit board with a larger width is to be manufactured, an increase in the yield of products can be achieved (or a reduction in the yield can be prevented).

Since aluminum has higher thermal conductivity and higher thermal dissipation capability than a resin composition, thermal load on a component to be mounted can be reduced. The reduction in thermal load allows (or facilitates) an increase in the density or the number of predetermined pieces of wiring or components or devices to be mounted. Additionally, aluminum blocks electromagnetic waves, and effects of external electromagnetic waves or unwanted emissions (EMI) to the outside can be prevented or suppressed. Further, the price of the base film 11 can be made lower than a case using a resin material (e.g., polyimide). For this reason, a reduction in product price can be achieved.

If the base film 11 is made of aluminum, formation of openings in the base film 11 can be performed by etching, which is also used in patterning of the predetermined conductor pattern 12. This eliminates the need for a punching unit and a die for forming openings in the base film 11. Facilities can be shared with a process of forming the predetermined conductor pattern 12. That is, the opening forming process and the conductor pattern forming process can share facilities. Accordingly, a reduction in manufacturing cost and facilities cost can be achieved.

If the second protective film 13 is composed of an aluminum film, the working-effects below can be produced. Aluminum is less expensive than a resin composition, and material cost can be reduced. Accordingly, a configuration using an aluminum film as the second protective film 13 can be manufactured at lower cost than a configuration using a film of a resin composition. Also, aluminum has higher thermal conductivity and higher thermal dissipation capability than a resin composition, and thermal load on a device or a component to be mounted can be further reduced. Additionally, since the conductor pattern 12 is sandwiched between the aluminum sheet 111 of the base film 11 and the aluminum film of the second protective film 13, effects of external electromagnetic waves or unwanted emissions (EMI) to the outside can be further prevented or suppressed.

The embodiment of the present invention has been described above in detail with reference to the drawings. The present invention, however, is not limited to the embodiment, and various modifications can be made without departing from the spirit and scope of the present invention. For example, although the embodiment has described a configuration including a single layer of a predetermined wiring pattern, a configuration including a plurality of layers of predetermined wiring patterns may be used instead.

The embodiment has described both a sprocket hole and a device hole as openings to be formed in a base film. Either one or both of sprocket holes and device holes may be formed. Openings to be formed in a base film are not limited to either one or both of sprocket holes and device holes. An opening of any kind may be used as long as the opening is formed in a base film and extends through the base film in a thickness direction.

The embodiment has described a flexible circuit board for TAB. The present invention, however, can also be applied to a flexible circuit board other than one for TAB. Although the embodiment has described a flexible circuit board, the present invention can also be applied to a circuit board without flexibility (a so-called rigid circuit board).

According to the present invention, an aluminum sheet is used as a base film. Deformation or a dimensional change caused by a temperature change or moisture absorption can be more effectively suppressed in the present invention than in a configuration using a film of a resin composition. Accordingly, an increase in the yield of products can be achieved. Also, since aluminum has higher thermal conductivity and higher thermal dissipation capability than a resin composition, thermal load on a component or a device to be mounted or the like can be reduced. The reduction in thermal load allows an increase in the number of layers of conductor patterns such as a circuit pattern and the density of components or devices to be mounted. Additionally, aluminum blocks electromagnetic waves, and effects of external electromagnetic waves or unwanted emissions (EMI) to the outside can be prevented or suppressed. Further, the price of the base film can be made lower than a configuration using a resin composition (e.g., polyimide). For this reason, a reduction in product price can be achieved.

If the base film is made of aluminum, formation of openings in the base film can be performed by etching, which is also used in patterning of a predetermined conductor pattern. This eliminates the need for a punching unit and a die for forming openings in the base film. Facilities can be shared with a process of forming the conductor pattern. That is, the opening forming process and the conductor pattern forming process can share facilities. Accordingly, a reduction in manufacturing cost and facilities cost can be achieved.

If a second protective film covering the predetermined conductor pattern is composed of an aluminum film, the second protective film can be manufactured at lower cost than a configuration using a resin composition. Also, aluminum has higher thermal conductivity and higher thermal dissipation capability than a resin composition, and thermal load on a component to be mounted can be further reduced. Additionally, since the conductor pattern is sandwiched between the aluminum sheet of the base film and the aluminum of the second protective film, effects of external electromagnetic waves or unwanted emissions (EMI) to the outside can be further prevented or suppressed.

What is claimed is:

1. A flexible circuit board comprising:
a base film including a first aluminum sheet, first protective films which continuously cover both surfaces of the first aluminum sheet, and a film of a thermosetting adhesive on one of the first protective films, and which has an opening extending through the base film in a thickness direction;
a conductor pattern formed on a surface of the film of the thermosetting adhesive included in the base film; and
a second protective film formed so as to cover the conductor pattern,
wherein the second protective film includes a second aluminum sheet, an electrically insulative film that covers a surface of the second aluminum sheet, and a film of a thermosetting adhesive formed on one surface of the second protective film, and which is bonded to the conductor pattern and the surface of the base film.

2. The flexible circuit board according to claim 1, wherein the opening is one or both of a sprocket hole and a device hole, which has an inner lead being a portion of the conductor pattern projecting toward the inner side of the device hole and being a portion electrically connecting to a device or an electronic component.

3. The flexible circuit board according to claim 1, wherein the second protective film is covering the conductor pattern except the inner lead and a contact pad, which is a portion of the conductor pattern, being a contact electrically connecting the flexible circuit board to the outside.

* * * * *